United States Patent [19]

Besocke et al.

[11] Patent Number: 5,325,010
[45] Date of Patent: Jun. 28, 1994

[54] MICROMANIPULATOR

[75] Inventors: Karl-Heinz Besocke, Julich; Martin Teske, Duren; Josef Frohn, Herzogenrath; Francis J. Wolf, Julich, all of Fed. Rep. of Germany

[73] Assignee: Forschungszentrum Jülich GmbH, Jülich, Fed. Rep. of Germany

[21] Appl. No.: 108,400

[22] Filed: Aug. 18, 1993

Related U.S. Application Data

[63] Continuation-in-part of Ser. No. 97,326, Jul. 26, 1993, which is a continuation of Ser. No. 622,388, Nov. 30, 1990, abandoned, which is a continuation of Ser. No. 373,915, Jun. 30, 1989, abandoned.

[30] Foreign Application Priority Data

Jul. 3, 1988 [DE] Fed. Rep. of Germany ....... 3822504

[51] Int. Cl.$^5$ .......................................... H01L 41/08
[52] U.S. Cl. ...................................... 310/317; 310/328
[58] Field of Search ................. 310/330–332, 310/328, 366, 316, 317; 318/116; 250/306, 440.1, 442.1

[56] References Cited

U.S. PATENT DOCUMENTS

| 4,163,168 | 7/1979 | Ishikawa et al. | 250/442.1 |
| 4,195,243 | 3/1980 | Thaxter | 250/442.1 |
| 4,343,993 | 8/1982 | Binning et al. | 310/328 X |
| 4,442,002 | 12/1983 | Binning et al. | 310/328 |
| 4,785,177 | 11/1988 | Besocke | 310/328 X |

FOREIGN PATENT DOCUMENTS 166499   1/1986   European Pat. Off. ......... 250/442.1

Primary Examiner—Mark O. Budd
Attorney, Agent, or Firm—Scully, Scott, Murphy & Presser

[57] ABSTRACT

A micromanipulator for the movement of an object relative to a treatment or analyzing position so that at least a part of the surface of the object can be treated or analyzed. The micromanipulator possesses a plurality of kinematic elements which support the object or an object holder and which, for this purpose, are equipped with a support for the object or the object holder. For the implementation of micromovements, the kinematic elements are piezo-electrically displaceable. The object is supported on at least one of the kinematic elements in such a manner that there can also be concurrently implemented micromovement and macromovements normal to the treatment or analysis plane of the object.

10 Claims, 6 Drawing Sheets

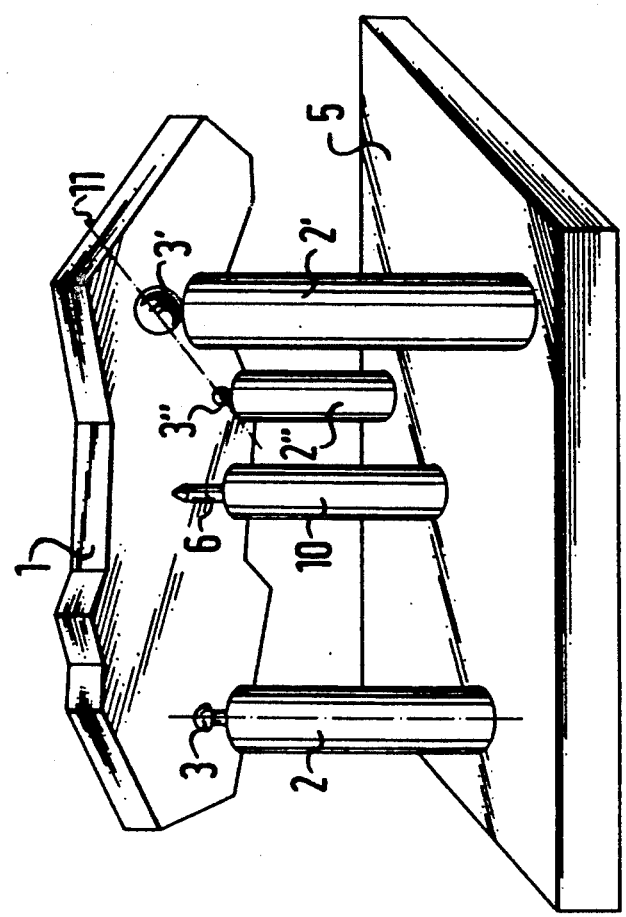
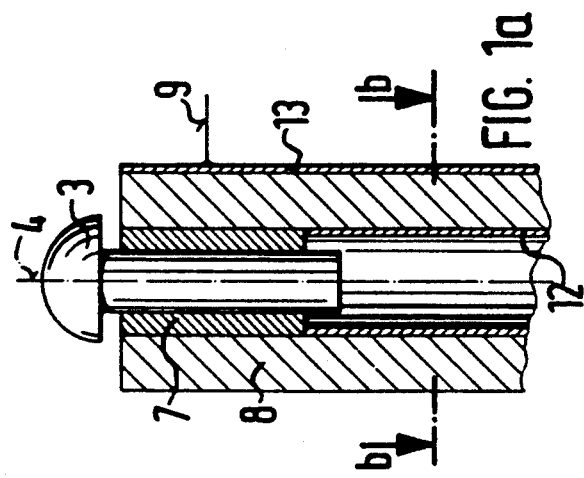
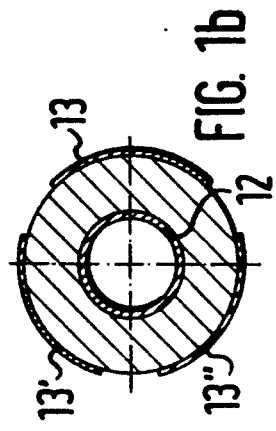

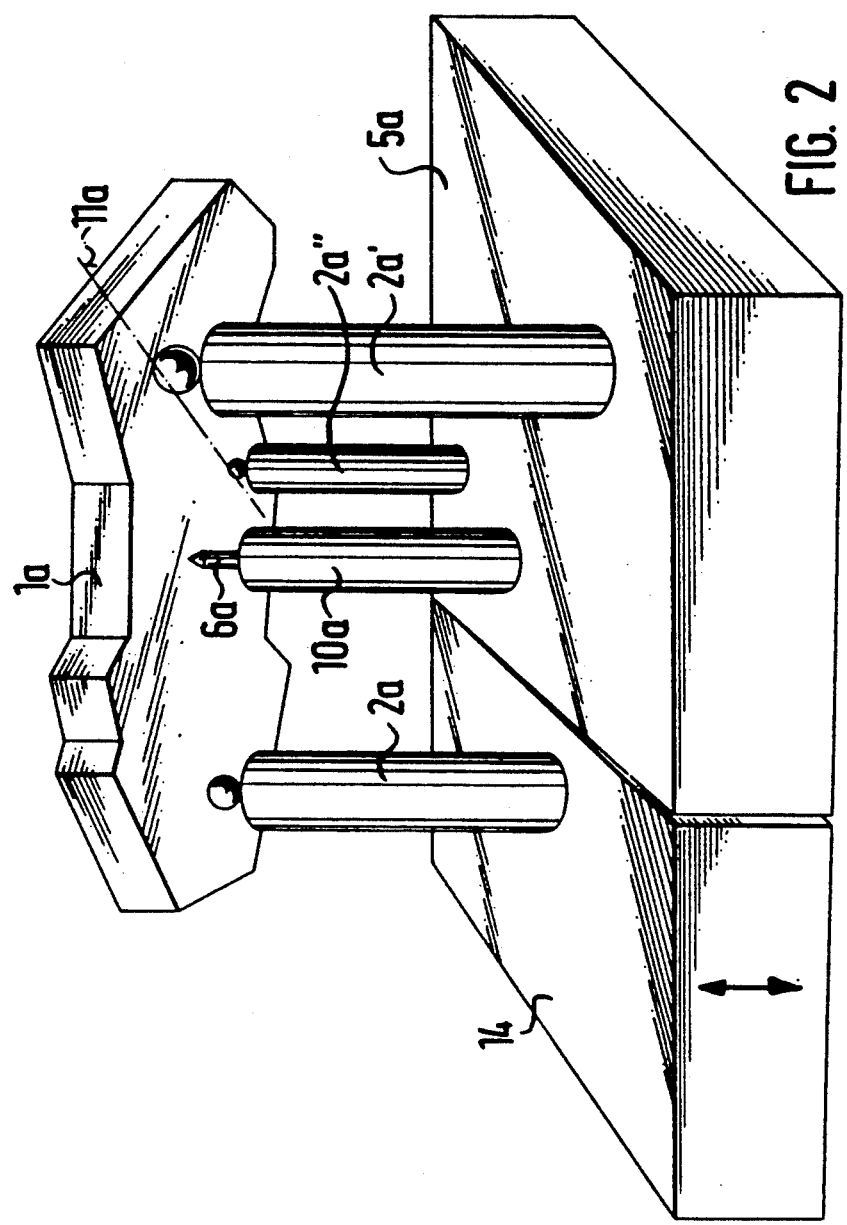

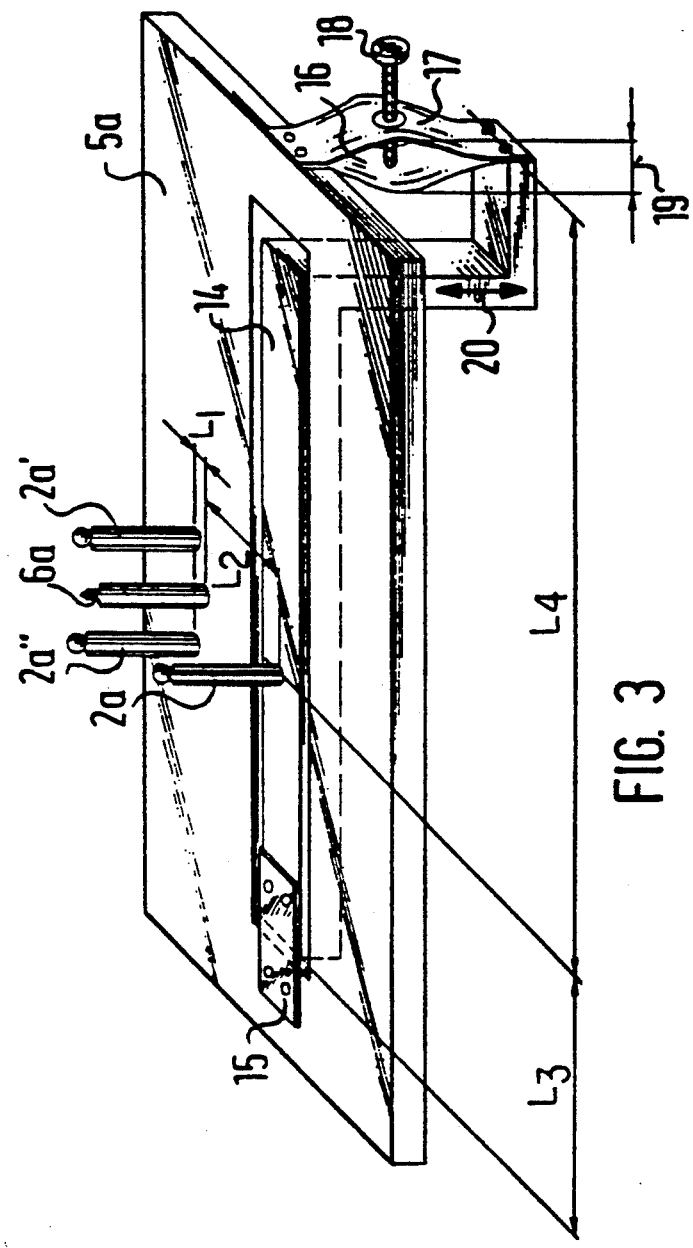

MICROMANIPULATOR

CROSS-REFERENCE TO RELATED APPLICATIONS

This application is a continuation-in-part application of Ser. No. 08/097,326, filed Jul. 26, 1993; which is a continuation of Ser. No. 622,388, filed Nov. 30 1990 now abandoned; which is a continuation of application Ser. No. 373,915, filed Jun. 30, 1989, now abandoned.

BACKGROUND OF THE INVENTION

1. Field of the Invention

The present invention relates to a micromanipulator for the movement of an object relative to a treatment or analyzing position so that at least a part the surface of the object can be treated or analyzed. The micromanipulator possesses a plurality of kinematic elements which support the object or an object holder and which, for this purpose, are equipped with a support for the object or tile object holder. For the implementation of micromovements, the kinematic elements are piezo-electrically displaceable.

Micromanipulators of this type are known for the effectuation of movements in scanning-tunneling microscopes (STM). The STM necessitates the highest degree of precision for the movement of the object which is currently to be examined relative to the scanning needle (tunneling tip) of the STM.

2. Discussion of the Prior Art

A micromanipulator is described in U.S. Pat. No. 4,785,177, assigned to the common assignee of the present application and the disclosure of which is incorporated herein by reference, in which a plurality of kinematic elements constituted of piezo-electric material are employed for the support of the object which is to be examined. The kinematic elements are constructed in such a manner that through micromovements it becomes possible to carry out translatory and also rotational movements, as well as a tilting of the object. The described micromanipulator is equipped for micromovements of the object, whereby in the addition of micromovements which are to be carried out it is also possible to implement macromovements. Normal to the above-mentioned object plane, there can be effectuated movements only to such an extent as is permissible by the deformation of the piezo-electric material attainable through the application of electrical voltages.

SUMMARY OF THE INVENTION

Accordingly, it is an objective of the present invention to create a micromanipulator with which, through the kinematic elements which are contemplated for the micromovements, there can also be concurrently implemented macromovements in every direction.

In essence, the invention is directed to the provision of a micromanipulator having one mechanism which is used to impart micromovements to an object, and a second mechanism which is used to impart macromovements to the object, although these two mechanisms have several common elements. More specifically, the manipulator of the present invention comprises a support base including first and second base segments supported for macroscopic movement relative to each other, and at least first and second kinematic elements connected to the first and second base segments respectively. The present invention further comprises macroscopic moving means connected to the first and second base segments to impart macroscopic movement to the first base segment relative to the second base segment, and thereby to impart macroscopic movement to the first kinematic element relative to the second kinematic element.

The mechanism to impart microscopic movement also includes at least one of these kinematic elements. More specifically, at least one of the kinematic elements includes a first member connected to and extending from the support base, and a second member slidably supported by that first member for microscopic movement relative to the first member. At least one of those first and second members includes a piezo electric material; and the microscopic moving means includes an electric voltage source connected to that piezo electric material to expand and contract that material and, thereby, to impart microscopic sliding movement to the second member relative to the first member.*

*The manipulation principle is also in the same manner applicable to the movement of the scanning needle.

The foregoing objective is attained in conformance with the invention for a micromanipulator of the above-mentioned type for the movement of an object relative to a treatment or analyzing position for the treating or analyzing of at least a part of the surface of the object, including a plurality of kinematic elements which support the object or an object holder, which are piezo-electrically displaceable for the implementation of micromovements, and which each possess a support for the object or the object holder. The object is supported on at least one of the kinematic elements in such a manner that there can also be concurrently implemented micromovement and macromovements normal to the treatment or analysis plane of the object. This facilitates a correlation of the distance between the treatment and analysis plane and the treatment work tool, for instance, the setting of the distance between the surface of the object which is to be treated or analyzed and the scanning needle of an STM, even at a rough object surface, whose roughness cannot be compensated for through micromovements alone through the deformation of the piezo-electric material, or after an exchange and mounting of the scanning needle.

Especially adapted for the macromovement is the support of one of the kinematic elements. Pursuant to a feature of the invention, this support is preferably movably supported within the kinematic element itself, in view of which there is simultaneously provided a guidance for the support on the kinematic element. It is expedient to so repose the support in an axially extending sleeve which is fastened within the kinematic element, that friction forces between mutually bounding surfaces of the support and sleeve will prevent any movement of the support within the sleeve. The friction forces must be calculated in such a manner that, on the one hand, they are adequate for the support of the object, and on the other hand, through the application of voltage functions to the piezo-electric kinematic element there is attainable a sliding of the support within the sleeve in an axial direction. Pursuant to this embodiment of the invention, the piezo-ceramic construction of the kinematic element is employable normal to the treatment or analysis plane for the micromovement as well as for the macromovement of the object.

Pursuant to a further purely mechanical variant of the invention, at least one of the kinematic elements of the micromanipulator is fastened on a partial segment of a base plate, which is macromovable. Pursuant to the invention, the partial segment is adjustable opposite the force of a spring which has one end thereof fastened to the base plate and the other end to the partial segment. In order to displace the partial segment, two leaf springs are arranged superimposed on each other, and which are spreadable with regard to each other. At the spreading apart of the leaf springs, this will change the distance between the fastening locations for the leaf springs on the base plate and partial segment, such that the partial segment is moved at a stationary base plate. It is essential that, due to the spreading apart of the leaf springs, there is produced a parabolic dependency between the path of the spread and the displacement of the partial segment, the displaceability increases with a more intense spreading apart of the leaf springs. Consequently, the leaf springs are arranged in such a manner on the partial segment that the setting sensitivity between the object and, for example, a scanning needle of an STM will be increased at a continual approach between the object and scanning needle.

Pursuant to a variant of the invention, in which the piezo-electric control for the kinematic elements is similarly utilized for the macromovement, this has the kinematic elements supporting the object or the object holder on a supporting plane which extends obliquely relative to the supporting direction of the kinematic elements, whose normal subtends an angle $\alpha$ relative to the supporting direction of the kinematic elements. When the oblique supporting plane is displaced as a result of the movement of the piezo-electric kinematic elements, the position of the object surface which is fixedly connected with the oblique plane changes in the supporting direction of the kinematic elements. The magnitude of the angle which is to be selected is, on the one hand, dependent upon the power or performance capacity of the piezo-electric kinematic elements with respect to their lateral deflectability at the support point, and on the other hand, upon the friction forces which reign at the support points for the kinematic elements on the surface of the supporting plane. In order to maintain the frictional forces at a low level, the supporting plane is preferably polished. Any movement of the supporting plane due to the kinematic elements or any movement of the micromanipulator at a stationary object is effected through the application of electrical voltage cycles to the piezo-ceramic of the kinematic elements. The selection of the angle $\alpha$ determines the extent of the displacement of the object surface which is to be treated or analyzed perpendicular or normal to the treatment or analysis plane; for example, essentially perpendicular to the scanning needle of the STM.

Preferably, the oblique supporting plane is helically configured and is supported in an axial direction by the kinematic elements, so that during the rotation of the support plane, the treatment or analysis plane will displace axially. It is expedient to subdivide the helically extending supporting plane into a plurality of identically configured segments, whereby each segment is supported by one of the kinematic elements.

BRIEF DESCRIPTION OF THE DRAWINGS

Reference may now be had to the following detailed description of exemplary embodiments of a micromanipulator pursuant to the invention, taken in conjunction with the accompanying drawings; in which:

FIG. 1 illustrates a perspective view of a micromanipulator including a kinematic element with a displaceable support;

FIG. 1a illustrates a longitudinal sectional view of a kinematic element with a displaceable support;

FIG. 1b illustrates a cross-sectional view through the kinematic element of FIG. 1a taken along line b—b;

FIG. 2 illustrates a perspective view of a micromanipulator with a mechanically movable kinematic element;

FIG. 3 illustrates a perspective view of the micromanipulator of FIG. 2 with a partial segment of the base plate which is attachable through the intermediary of leaf springs;

DETAILED DESCRIPTION

Figure 4:
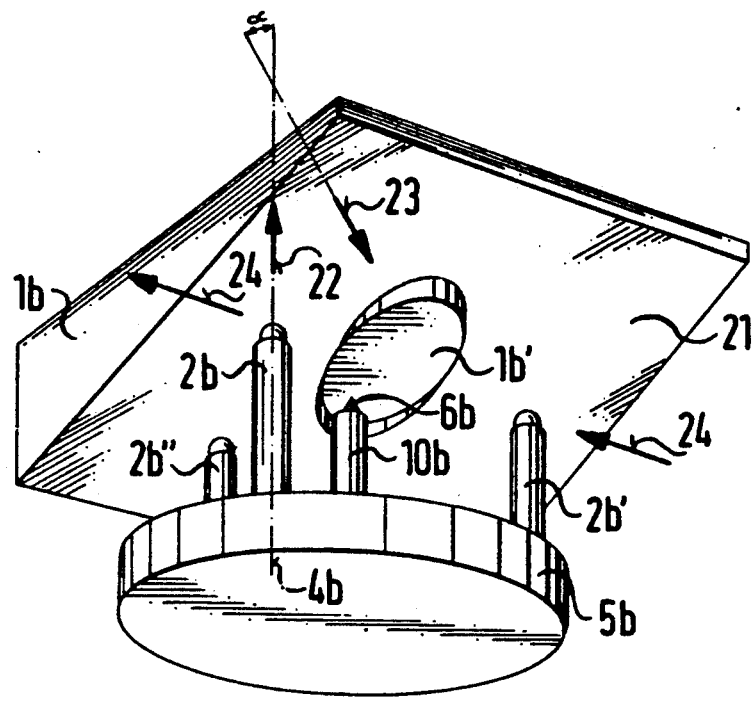
FIG. 4 illustrates a perspective view of a micromanipulator with an oblique supporting plane.

FIG. 1 of the drawings illustrates a micromanipulator for the movement of an object or object holder 1 through the intermediary of three kinematic elements 2, 2', 2" which support the object holder. The object holder lies on supports 3, 3', 3" of the kinematic elements in a stable position. The kinematic elements 2, 2', 2" which, in the exemplary embodiment, are cylindrical in shape, are fastened with vertically extending cylinder axes 4 on a base plate 5. The micromanipulator serves for the movement of the object relative to a scanning needle 6 which, in the exemplary embodiment, is arranged intermediate the kinematic elements 2, 2', 2" on a kinematic element 10, and is likewise fastened on the base plate 5.

In the illustrated embodiment, the foregoing pertains to a micromanipulator for an STM, whereby the object 1 is displaceable within the nanometer range relative to the scanning needle 6 of the STM. The positioning of the scanning needle 6 on the base plate 5 intermediate the kinematic elements 2, 2', 2" is not absolutely necessary. The scanning needle with the kinematic element 10 can also be fastened at another location on the base plate. Because of the not negligible temperature drift between the kinematic elements 2, 2', 2" and the scanning needle 6 during a treatment or analysis of the object surface through the intermediary of the STM, the positioning of kinematic elements and scanning needle on the same base plate is, however, of considerable advantage.

In the illustrative embodiment pursuant to FIG. 1, the supports 3', 3" are rigidly connected with the associated kinematic elements 2', 2". In contrast therewith, the support 3 of the kinematic element 2 is movably arranged. As is illustrated in FIG. 1a, the support 3 is inserted into a sleeve 7 so as to axially extend within the kinematic element 2, whose piezo-electric material 8 is shaped in the form of a tube. In the illustrated embodiment, the sleeve 7 is embedded in the piezo-electric material 8. As a result of the application of electrical voltage cycles to the piezo-electric material through electrical conductors 9 and 12, the sleeve can be displaced with regard to the support through deformation of the material. Hereby, ramming effects support the movement; in particular, the support can be displaced through impacts exerted against the object or object holder The electrical conductors 9 and 12 are supplied with power from a generator, which serves for the generating of the desired control voltages for the necessary deformations of the piezo-electric material. The above-mentioned generator is not shown in the drawing.

The sleeve 7 and the support 3 are dimensioned in such a manner that friction forces reign between their mutually adjoining surfaces, which normally retain the support 3 immovably within the sleeve 7 at a superimposed object or, respectively, object holder 1. For effectuating the displacement of the support 3, control voltage pulses are applied to the piezo-electric material 8, such that the piezo-electric material will spontaneously stretch or contract axially and thereby overcome the adherent friction forces which are present between the sleeve 7 and the support 3, so that because of its inertia the support will displace within the kinematic element relative to the sleeve. In this manner, there can be implemented upward as well as downward movements of the support in the kinematic element.

During a movement of the support 3 within the kinematic element 2, the position of the object 1 changes relative to the scanning needle 6. In the exemplary embodiment, the object 1 is tilted about an axis 11, as shown in FIG. 1, whose position is specified by the immovably remaining supports 3', 3'' of the kinematic elements 2', 2''. With the tilting of the object 1 about the axis 11 there is produced a movement between the scanning needle and the surface on the object which is to be treated or analyzed which is also in the macro range.

If there is to be achieved a parallel movement of the object instead of the tilting movement, it is understandably possible to equip all of the kinematic elements 2, 2', 2'' with a movable support 3. The object or the object holder then allow themselves to be uniformly moved through the application of corresponding control voltage pulses.

For the micromovement of the object, the kinematic elements 2, 2', 2'', as shown in the illustrated embodiment, are collectively hollow cylindrically constructed, as is shown in FIG. 1a for the kinematic element 2 by a longitudinal sectional view. In FIG. 1b there is represented a cross-section through the kinematic element, taken along section line b—b in FIG. 1a perpendicular to the cylinder axis 4. From the drawing figures there can be ascertained that the piezo-electric material 8 is covered on its inside with an internal electrode 12, and on its outside with strip electrodes 13, 13', 13'', which extend along the direction of the cylinder axis 4. When voltage cycles are applied to the electrodes, then the kinematic elements allow themselves to either change in their lengths or to bend. In accordance with the invention, only the regulation of these voltage cycles is needed in order to move the object or object holder in every direction, whereby macromovements are attained through stepwise additions of micromovements also perpendicular to the treatment or analysis plane of the object.

In the illustrated embodiment pursuant to FIG. 1a, the elements which are necessary for the vertical movement of the object, namely, the movable support 3 and the sleeve 7 which is embedded in the piezo-electric material 8, are integrated into the kinematic element. However, these elements can also be arranged separately and connected with the kinematic element.

As mentioned hereinabove and illustrated in FIGS. 1, 1a, and 1b of the present application, the above-discussed first member of the kinematic element is comprised of sleeves 7 and 8, and the above-discussed second member of the kinematic element is comprised of support member 3.

Hereby, in order to move support member 3 upwardly, a slow voltage ramp is applied to the piezo electric element 8, and this causes a slow upward movement of the piezo electric element and a slow upward movement of the sleeve 7 and the support member 3. Afterwards, a voltage pulse of opposite direction is applied to cause the piezo electric element 8 to contract quickly downward, causing sleeve 7 to also move downward quickly. Due to its inertia, however, the support member 3 will not slide downward unitarily with the sleeve 7, and the support member 3 will more or less remain in its prior position. After this action, the new position is below the position at which sleeve 7 engaged member 3 before the start of the slow upward movement of sleeves 7 and 8 and support member 3. The above-described changes, the shortening, take place so rapidly that while these changes occur, there is either no or only a slight change in the position of the support member 3, due to the inertia of that support member. This sequence of slow and rapid movement of the piezo electric material 8 and sleeve 7 can be repeated or carried out continuously in order to move the support member 3 stepwise upward relative to sleeves 8 and 7.

To be able to move the support member 3 downwardly, this sequence of slow and fast movements of the piezo electric material 8 is applied in the opposite order. First, a slow voltage ramp is applied to lower the sleeve 7 and support 3. Then, a voltage pulse of opposite polarity is applied to cause the piezo electric element 8 to expand quickly upward, causing sleeve 7 to also move upward quickly. As a result of its inertia, however, support member 3 will not slide upward unitarily with the sleeve 7, but the support member 3 will more or less remain in its prior position. At the end of this action, sleeve 7 is engaged to the support 3 above the position at which sleeve 7 engaged member 3 before the start of the slow downward movement of sleeves 7 and 8 and support member 3. This sequence of slow and rapid movement of the piezo electric material 8 and sleeve 7 can be repeated continuously in order to move the support member 3 stepwise downward relative to sleeves 8 and 7.

Figure 7A:
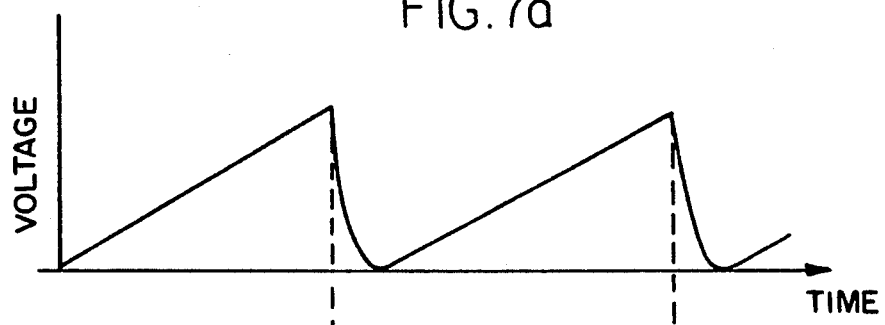
FIG. 7a illustrates a graph of the configuration of applied voltage pulses plotted over time for effectuating the relative displacement between the elements.
Figure 7B:
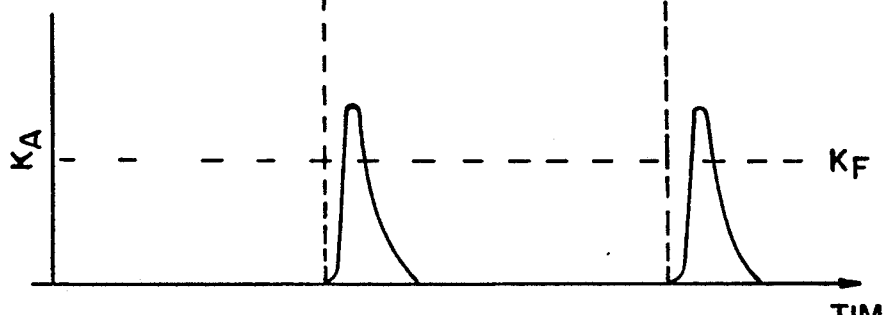
FIG. 7b illustrates a graph similar to that in FIG. 7a showing the acceleration forces plotted over time.

More specifically, as illustrated in the graphs of FIGS. 7a and 7b, support member 3 is held by sleeve 7, and in particular, by the frictional force $K_F$ between support member 3 and sleeve 7. This frictional force must be greater than the force of gravity $K_G$ on support member 3 and any load thereon. Thus, $K_F > K_G$. In order to move the support member 3 relative to sleeve 7, acceleration forces $K_A$ have to be applied to member 7 and 8 to overcome the frictional force $K_F$. Thus, $K_A > K_F$, and it follows of course that $K_A > K_G$.

The acceleration force $K_A$ is given by the following equation: $K_A = m \cdot b$,
where m is the effective mass of member 7 and 8, and b is the acceleration of the member 7 and 8.

The acceleration b is proportional to the change of the driving velocity, v, over time; that is, $$b = \frac{dV}{dt},$$

and it follows that $$K_A = m \cdot \frac{dv}{dt}.$$

This evidences that $K_A$ can be adjusted by changing $$\frac{dv}{dt}.$$

The velocity with which the piezo electric material moves is controlled by the voltage applied to that material, and this voltage is applied by a pulse generator having a variable pulse rise time. When the voltage rise time is short, the acceleration force $K_A$ is high and can overcome the frictional force $K_F$; and when this happens, support 3 moves within and relative to sleeve 7.

The graphs of FIGS. 7a and 7b show the shape of the applied voltage pulses, and the associated $K_A$, over time. The acceleration force has a maximum value at the time of a very rapid change in the applied voltage; and to produce a relative movement of support 3, $K_A$ has to be equal to or greater than $K_F$. As can be seen, by suitably selecting the applied voltage pulse, in combination with selecting or controlling $K_F$, a $K_A$ can be developed that exceeds $K_F$ for a period of time.

In FIG. 2, there is represented a micromanipulator, in which one of the kinematic elements 2a, 2a', 2a", in the illustrated embodiment the kinematic 2a is arranged on a partial segment 14 which is movable relative to the base plate 5a. Upon the movement of the partial segment 14, in the illustrated embodiment there is assumed a movement of the partial segment perpendicularly or normal to the surface of the base plate 5a, the object holder 1a of the micromanipulator according to FIG. 2, analogous to the object 1 of FIG. 1, is tilted about an axis 11a which extends through the supporting points of the kinematic elements 2a', 2a" on the object holder 1a. For the micromovement of the object, the kinematic elements 2a, 2a', 2a" are configured in the same manner as the kinematic elements 2, 2', 2" according to FIGS. 1, 1a and 1b.

A partial segment 14a which is fastened to the base plate 5a intermediate leaf springs is illustrated in FIG. 3. The segment 14a has one end thereof fastened through a leaf spring 15 to the base plate 5a, and is with the other end connected to the base plate 5a through two leaf springs 16, 17 which in the unstressed condition thereof are arranged matingly superimposed on each other. The leaf springs 16, 17 allow themselves to be spread apart through the intermediary of a clamping screw 18. Hereby, the extent of displacement of the partial segment 14a increases parabolically with an increasing spread in dependence upon the distance in the spread 19 between the leaf springs 16, 17. The leaf springs 16, 17 are arranged in such a manner between the base plate 5a and segment 14a that at a continuing approach between the object and scanning needle, the sensitivity in the positioning of the segment 14a increases during the adjustment of the clamping screw 18. In the illustrated embodiment pursuant to FIG. 3, the leaf springs 16, 17 are for this purpose arranged in parallel with the direction of displacement 20 for the partial segment 14a between the base plate and the partial segment. During the spreading apart of the leaf springs, the segment 14a is raised against the force of the leaf spring 15, so that the object holder and object will lift away from the scanning needle. During the lowering of the object due to the unstressing of the leaf springs 16, 17, the sensitivity in the setting increases during the adjustment of the clamping screw 18 with the narrowing distance between the surface of the object and the needle tip of the scanning needle.

The reduction ratio between the extent of displacement of the partial segment which is produced through the spreading of the leaf springs 16, 17 and the distance between the surface of the object and the scanning needle is variable within wide bounds through the selection of the lever ratios $L_1:L_2;L_3:L_4$, as well as through an increase in the pitch of the screw threads of the clamping screw 18.

A micromanipulator, whose kinematic elements 2b, 2b', 2b" support an inclined or oblique supporting plane 21, is illustrated by FIG. 4. The supporting plane 21 is a component of the object holder 1b with which the object 1b' which is to be treated or examined is fixedly connected. Also the micromanipulator which is represented in FIG. 4 serves for the movement of an object holder of an STM, whose scanning needle 6b with its kinematic element 10b and Jointly with the kinematic elements 2b 2b', 2b" is arranged on one and the same base plate 5b.

The kinematic elements 2b, 2b', 2b" which, pursuant to the illustrated embodiment of FIG. 4, are similarly cylindrically constructed, stand vertically on the base plate 5b, and their cylinder axes 4b are oriented in parallel with the supporting direction 22 of the kinematic elements. The supporting direction 22 and the normal 23 of the support plane 21 extend angled relative to each other. The angle α which is formed between the supporting direction 22 and the normal 23 is so selected, that even at a movement of the object carrier 1b by means of the piezo-electrically excitable kinematic elements, there is provided an adequate adherence between the supports 3b, 3b', 3b" of the kinematic elements and the surface of the oblique supporting plane. The object carrier 1b is not permitted to slide on the kinematic elements. In addition thereto, for the selection of the angle, there must be considered the performance capacity of the piezo-electric kinematic elements for the movement of the object carrier. With an increasing performance capacity, the angle allows itself to be increased.

During the movement of the kinematic elements, the oblique supporting plane allows itself to be displaced, and thereby to change the distance between the surface of the object and the needle tip of the scanning needle. The distance between the needle tip and the surface of the objective remains constant when the oblique plane is displaced in parallel with a horizontal edge; in FIG. 4 such a displacement is indicated during a displacement of the object carrier in the direction of the arrows 24.

Figure 5:
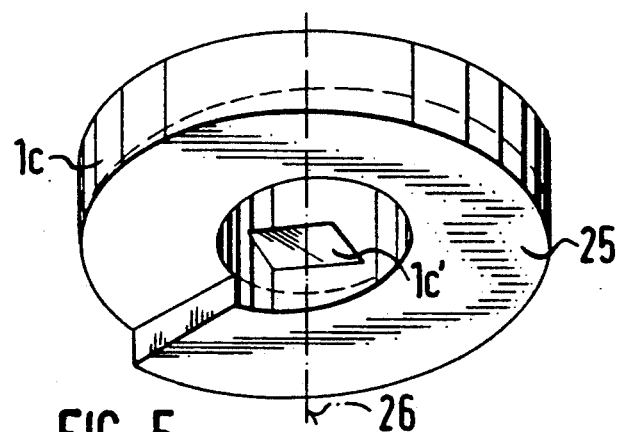
FIG. 5 illustrates a perspective view of a helically extending supporting plane for a micromanipulator.

FIG. 5 illustrates an object holder 1c with a helically extending supporting plane 25. During the rotational movement of the support plane 25, the object 1c' which is centrally arranged in the object holder 1c is displaced in the direction of the helix axis 26 through the intermediary of kinematic elements which are not shown in FIG. 5.

Figure 6:
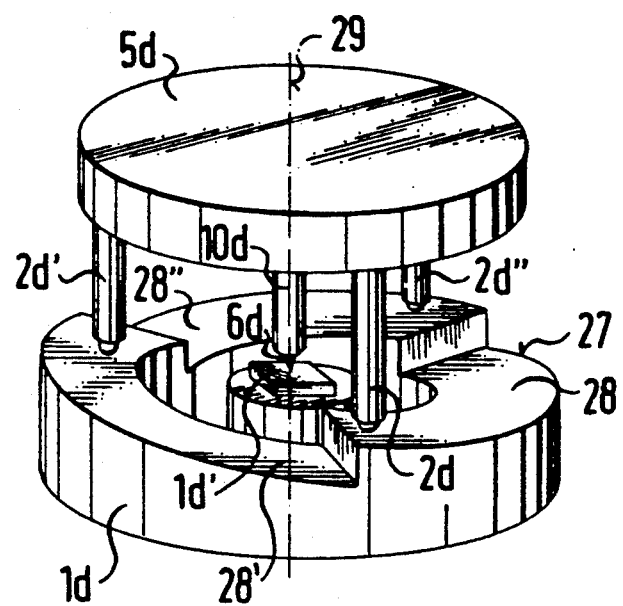
FIG. 6 illustrates a perspective view of a micromanipulator with a supporting plane possessing helically extending segments.

A micromanipulator which is likewise equipped with a helical supporting plane is illustrated in FIG. 6. The object holder 1d of this micromanipulator possesses a supporting plane 27 which is constituted of a plurality, in the illustrated embodiment of three helically extending segments 28, 28', 28''. Each of the segments in this embodiment is identically configured, in particular, the helix surfaces each evidence an identical pitch or gradient, in the illustrated embodiment, for each segment. The segments 28, 28', 28'' are respectively supported by one of the kinematic elements 2d, 2d', 2d''. In the illustrated embodiment, the object holder 1d is stationarily arranged and the micromanipulator is freely movable along the supporting plane. The micromanipulator moves in the direction along a central axis 29, when the kinematic elements rotate the micromanipulator over the supporting plane about the central axis. Centrally arranged in the object holder 1d is the object 1d' which is to be treated or analyzed. The surface of the object extends in parallel with the base plate 5d of the micromanipulator on which, in the same manner as in all previously described exemplary embodiments, there is fastened a scanning needle 6d of an STM with its kinematic element 10d and the kinematic elements 2d, 2d', 2d''. During the rotation of the micromanipulator through the kinematic elements, the distance between the surface of the object and the needle tip of the scanning needle 6d is either reduced or increased. Once the distance between the sample and the scanning needle is adjusted, the excitation of the kinematic elements 2d, 2d', 2d'' can be switched electronically from the rotation to the normal operation mode. In this mode the sample can be transported in any direction in the plane of the sample surface without changing the distance between scanning needle and sample.

A motion cycle as mentioned hereinabove is set forth in U.S. Pat. No. 4,785,177; and is generally as follows:
  (a) Through the synchronized and uniform elongation of all thee kinematic elements, the object is initially raised in a first step a in a Z-direction away from the operative position of the tunneling tip.
  (b) In the second step b, the kinematic elements are rapidly lowered in the Z-direction, pivoted hereby in the X-Y plane and again raised, such that there is obtained a somewhat semi-circular path as the line of movement. This second step b is so controlled in duration, that the speed of lowering of the supports in the Z-direction is higher than the movement of the object in the same direction under the influence of gravity. The supports of the kinematic elements detach themselves at one point from the object during the second operating step, because of the inertia of the object, and will again support the object at another point at the end of the operating step.
  (c) The third step c is a slow movement of the support in the X-Y plane, whereby the object remains resting on the three kinematic elements, and is being transported in the direction of the movement of the kinematic elements the distance between the above-mentioned points.
  (d) After completion of the transport the object is lowered in the fourth step to the normal operation distance of the tunnel tip in Z-direction. AT the end of this operating step, the kinematic elements are again located in their initial position, and the object has been displaced by the distance between the points.

The operating steps b and c can be repeated for so long, until the object has reached the operating position which is desired for the STM examination. Thereafter follows step d for approaching the tunnelling distance between the tip and object surface.

A motion sequence for the kinematic elements which is simplified in comparison with the above-described sequence has them actuated in only two operating steps;
  (a) As the first step a there is effected a rapid movement of the support on the object surface from one point towards another point. During its movement of the kinematic elements, because its inertia the object again remains in an almost unchanged position.
  (b) During the second step b the kinematic elements are slowly returned to their initial positions carrying the object over the distance between the points.

Each of the motion sequences can be carried out as a single step or can be repeated by applying of voltage pulse sequences to the kinematic elements. The step width and the step frequency of the supports on the kinematic elements can be varied within a wide range by a suitable control of voltage amplitude and pulse frequency. With the used piezoelectric kinematic elements reproducible micro steps of less than 10 nm could be carried out.

The motion sequences which can be carried out by means of the kinematic elements are not limited, it is possible to correlate the movement of the kinematic elements with the applicable case of utilization. For example, in addition to the above-described motion sequences, there are also possible elliptical movements of the supports, or an upward throw of the object with a rapid positional change of the supports. The control of the motion sequences is hereby carried out with consideration being given to the inertia of the object.

By means of the described kinematic arrangement it is also possible to impart rotation to the objects around an axis perpendicular to the support plane. The rotation of the object is effected through suitable vectorial addition of the voltages in the X- and Y-direction for each individual kinematic element. Moreover, the objects can also be tilted. For this purpose, the individual kinematic elements are to be differently elongated or shortened. The kinematic arrangement, in addition to translatory motions also allows for a rotation and tilting of the objects.

For the adjustment of the distance between the surface of the object which is to be treated or analyzed, in the illustrated embodiments, also the kinematic elements 10d with the scanning needles are movable piezoelectrically.

U.S. Pat. No. 4,785,177, which is expressly discussed in the present specification, specifically electric material to extend and contract that material.

Figure 8:
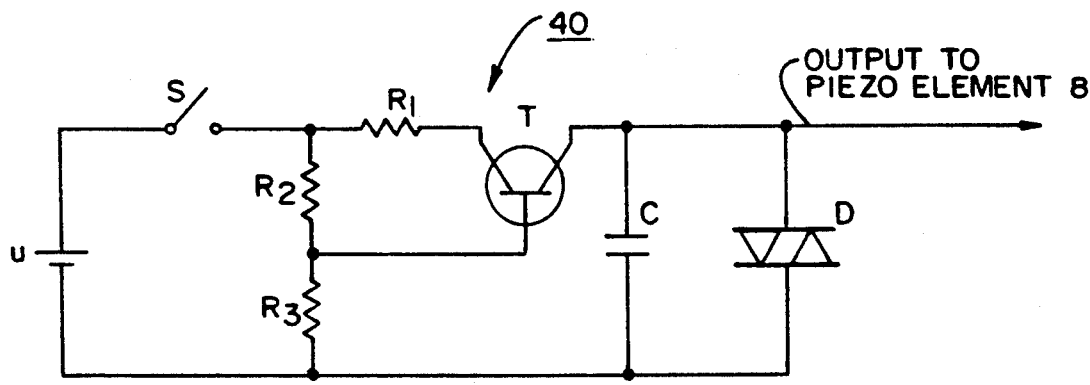
FIG. 8 illustrates a typical switching circuit to produce the desired voltage cycle applied to the kinematic element.
Figure 9:
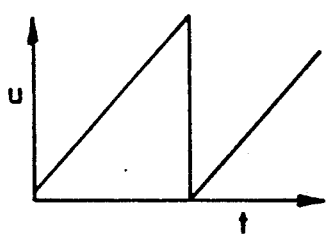
FIG. 9 illustrates the output voltage cycle of the circuit of FIG. 8.

A switching circuit 40 (shown in FIG. 8) which may be employed to produce the desired voltage cycle applied to piezo kinematic element 2. This switching circuit includes transistor T, capacitor C, and a switching diode D having a breakdown voltage of about 30 volts. FIG. 9 of the drawings also shows the output voltage cycle of the switching circuit 40 which may be applied to piezo kinematic element 2 in order to move that element 2 in the desired manner.

Parameters in the operation of the switching circuit 40 may be as follows; by way of example:

u—power supply 40V
$R_1$—5 kΩ
$R_2$—27 kΩ
$R_3$—270 kΩ
T—transistor BC 546
C—capacitor 10 μF
D—switching diode 30V
S—switch The switching circuit 40 is basically a simple circuit essentially known for producing an output voltage having a sawtooth or ramp shape pattern, derived from constant voltage source μ. It is well within the ability of one of ordinary skill in the art to construct and use this, or other, similar types of switching circuits, to apply the voltage pattern to piezo kinematic element 2 as necessary to expand and contract the kinematic element 2 in the manner hereinbefore described.

Figure 10:
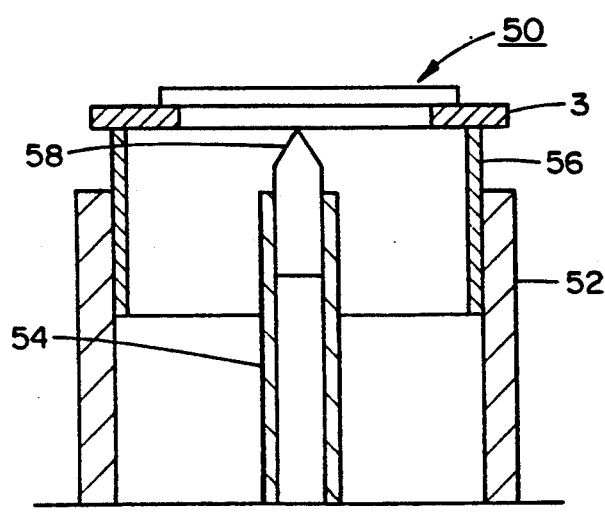
FIG. 10 illustrates, generally diagrammatically, a further embodiment of a micromanipulator having less than three kinematic elements.

The present invention may also be embodied in a device 50 having less than three kinematic elements, as shown in FIG. 10 of the drawings.

The device 50 shown in FIG. 10 comprises an outer piezo tube 52, an inner piezo tube 54 and a sliding tube 56. The inner piezo tube 54 supports and is utilized to move the tunneling tip 58. The sliding tube 56 is located immediately inside of and slidably engages the outer piezo tube 52. Hereby, the outer piezo tube 52 is employed to move the sliding tube upwardly and downwardly; and thereby move the object being supported thereon, the same manner that kinematic element 2 is used to move support 3 upwardly and downwardly.

What is claimed is:

1. A micromanipulator for imparting microscopic and macroscopic movements to an object, comprising:
   a support base including first and second base segments supported for macroscopic movement relative to each other;
   a plurality of kinematic elements for supporting the object, at least a first of the kinematic elements being connected to the first base segment, and at least a second of the kinematic elements being connected to the second base segment, one of said first and second kinematic elements including
      (i) a first member connected to the support base, and
      (ii) a second member slideably supported by the first member for microscopic movement relative to said first member,
   one of said first and second members including an adjustable length piezo-electric material;
   macroscopic moving means connected to the first and second base segments to impart macroscopic movement to the first base segment relative to the second base segment and, thereby, to impart macroscopic movement to the first kinematic element relative to the second kinematic element; and
   microscopic moving means including an alternating current electric voltage source connected to the piezo-electric material to expand and contract the piezo-electric material to impart microscopic sliding movement to the second member and to the object relative to the first member.

2. A micromanipulator as claimed in claim 1, wherein:
   said first member includes a sleeve;
   said second member is supported by the sleeve for sliding movement relative thereto;
   said second member frictionally engages said sleeve, said frictional engagement inhibiting sliding movement of the second member; and
   the microscopic moving means expands and contracts the piezo-electric material to overcome frictional forces between the second member and the sleeve and to slide the second member relative thereto.

3. A micromanipulator as claimed in claim 1, comprising a spring having a first end connected to the first base segment, and a second end connected to the second base segment.

4. A micromanipulator as claimed in claim 1, wherein:
   the macroscopic moving means comprises:
      (i) a first leaf spring connected to both of the first and second base segments, and
      (ii) a second leaf spring superimposed over the first leaf spring and also connected to both the first and second base segments; and
   the first and second leaf springs are spread apart from each other to impart macroscopic movement to the first base segment relative to the second base segment.

5. A micromanipulator as claimed in claim 1, wherein:
   each of the kinematic elements defines a respective longitudinal axis, and the longitudinal axes defined by the plurality of kinematic elements are substantially parallel to each other and extend in a first direction;
   each of the kinematic elements has a top end, and the top ends of the kinematic elements define a supporting plane; and
   an axis perpendicular to the supporting plane extends at an angle α relative to said first direction.

6. A micromanipulator as claimed in claim 5, comprising a holder for holding the object, said holder defining a helically extending surface mounted on and supported by the top ends of the kinematic elements.

7. A micromanipulator as claimed in claim 6, wherein:
   the helically extending surface includes a plurality of helically extending surface segments; and
   each of the helically extending surface segments is supported by at least one of the kinematic elements.

8. A micromanipulator as claimed in claim 4, wherein the macroscopic moving means further includes adjustment means engaging both the first and second leaf springs to move said leaf springs toward and away from each other.

9. A micromanipulator as claimed in claim 8, wherein the adjustment means includes a clamping screw engaging the first leaf spring, and threadably engaging the second leaf spring.

10. A micromanipulator as claimed in claim 1, wherein:
    said first member includes a tube connected to the support base and made of the piezo-electric material, said tube including upper and lower portions; and
    said second member includes a sleeve located inside and frictionally engaging the upper portion of the tube.

* * * * *

UNITED STATES PATENT AND TRADEMARK OFFICE
CERTIFICATE OF CORRECTION

PATENT NO. : 5,325,010
DATED : June 28, 1994
INVENTOR(S) : Karl-Heinz Besocke, et al.

It is certified that error appears in the above-indentified patent and that said Letters Patent is hereby corrected as shown below:

Column 1, line 21: "tile" should read --the--
    Column 5, line 11: after "holder" insert --.--
    Column 7, line 8: "$b = \frac{dV}{dt}$" should read --$b = \frac{dv}{dt}$--

Column 8, line 32: "Jointly" should read --jointly--

Column 10, line 58: after "specifically" insert --teaches the manner of applying a voltage to a piezo--

Column 11, line 31: after "thereon" insert --in--

Signed and Sealed this

Twenty-second Day of November, 1994

Attest:

BRUCE LEHMAN

*Attesting Officer*     *Commissioner of Patents and Trademarks*